(12) United States Patent
Pegler

(10) Patent No.: US 6,812,079 B1
(45) Date of Patent: Nov. 2, 2004

(54) METHOD FOR A JUNCTION FIELD EFFECT TRANSISTOR WITH REDUCED GATE CAPACITANCE

(75) Inventor: Pete L. Pegler, Mesa, AZ (US)

(73) Assignee: Lovoltech, Inc., Santa Clara, CA (US)

( * ) Notice: Subject to any disclaimer, the term of this patent is extended or adjusted under 35 U.S.C. 154(b) by 0 days.

(21) Appl. No.: 10/677,570

(22) Filed: Oct. 1, 2003

Related U.S. Application Data

(62) Division of application No. 10/278,303, filed on Oct. 22, 2002, now Pat. No. 6,696,706.

(51) Int. Cl.[7] .............................................. H01L 21/337
(52) U.S. Cl. ....................................... 438/186; 438/914
(58) Field of Search ................................ 438/186, 188, 438/194, 195, 197, 356, 357, 358, 414, 914

(56) References Cited

U.S. PATENT DOCUMENTS

| | | | | | |
|---|---|---|---|---|---|
| 5,396,085 A | * | 3/1995 | Baliga | ........................ | 257/77 |
| 5,945,699 A | * | 8/1999 | Young | ........................ | 257/256 |
| 6,251,716 B1 | * | 6/2001 | Yu | ........................ | 438/186 |
| 6,307,223 B1 | * | 10/2001 | Yu | ........................ | 257/256 |
| 6,696,706 B1 | * | 2/2004 | Pegler | ........................ | 257/135 |

* cited by examiner

*Primary Examiner*—David Nhu
(74) *Attorney, Agent, or Firm*—Wagner, Murabito & Hao LLP

(57) ABSTRACT

An apparatus and method for a semiconductor device with reduced gate capacitance. Specifically, an n-channel or p-channel junction field effect transistor (JFET) is described including an appropriately doped substrate forming a drain region, an epitaxial layer formed on top of the substrate, a control structure including a gate region implanted into the epitaxial layer, a source region sharing a p-n junction with the gate region, and an altered epitaxial region. The altered epitaxial region is formed by implanting either $n^-$ or $p^-$ dopants directly below the gate region of either the n-channel or p-channel JFET for widening a depletion region surrounding the gate region. The enlarged depletion region reduces the gate capacitance of the JFET between the gate and drain regions.

20 Claims, 7 Drawing Sheets

METHOD FOR A JUNCTION FIELD EFFECT TRANSISTOR WITH REDUCED GATE CAPACITANCE

This application is a Division of Ser. No. 10/278,303 filed on Oct. 22, 2002 now U.S. Pat. No. 6,696,706.

BACKGROUND OF THE INVENTION

1. Field of the Invention

Embodiments of the present invention relate to the field of junction field effect transistors (JFETs). More particularly, embodiments of the present invention relate generally to a JFET with reduced junction gate capacitance.

2. Related Art

Junction field effect transistors (JFETS) are majority carrier devices that conduct current through a channel that is controlled by the application of a voltage to a p-n junction. The JFET semiconductors may be constructed as p-channel or n-channel devices and may be operated as enhancement mode devices or depletion mode devices.

The most common JFET semiconductor is the depletion mode type. The depletion mode device is a normally "on" device that is turned off by reverse biasing the p-n junction so that pinch-off occurs in the conduction channel. For example, p-channel depletion mode devices are turned off by the application of a positive voltage (+VGS) between a gate and source region. Alternatively, n-channel depletion mode devices are turned off by the application of a negative voltage between (–VGS) between a gate and source region.

Enhancement mode, or normally "off" JFETs are characterized by a channel that is sufficiently narrow such that a depletion region at zero applied voltage extends across the entire width of the channel. Application of a forward bias reduces the width of the depletion region in the channel, thereby creating a conduction path in the channel. A p-channel enhancement mode JFET is turned on by the application of a negative voltage (–VGS) between a gate and source region. Alternatively, n-channel enhancement mode JFETs are turned on by the application of a positive voltage (+VGS). The input voltage of an enhancement mode JFET is limited by the forward breakdown of the p-n junction.

The JFET transistor can be implemented within modern electronic circuit applications that frequently require DC power supplied at regulated voltage levels to a microprocessor. For example, in the area of low voltage and high current applications, DC to DC converters, such as, voltage regulator modules (VRMs), are typically used to maintain the output voltage of a power supply at a constant level. Typical circuits known as DC-DC converters include a buck converter, boost converters, and the buck boost converter, etc.

The next generation of computer microprocessor will operate at significantly lower voltages and higher currents. As such, microprocessors may require highly accurate supply voltage regulations in which the VRM is located on the mother board next to the microprocessor load to increase high power density and to operate at high efficiency. To meet these requirements, the power conversion must be performed at a high switching frequency.

However, higher switching frequency in a power converter is associated with larger switching losses due to large gate to drain capacitance in traditional JFET devices in VRM circuitry. The result is power dissipation in the VRM device with excessive heat generation and a reduction in overall circuit efficiency. Prior Art FIG. 1 illustrates a semiconductor device 100 including a plurality of n-channel JFETs showing high gate to drain capacitance.

Semiconductor device 100 includes a $n^{++}$ substrate 160 that forms a drain region for a plurality of n-channel JFET transistors. An n-type epitaxial layer 120 is disposed on top of the $n^{++}$ substrate 120. A plurality of source regions 130 is formed on a surface of the n-type epitaxial layer 120. A plurality of gate regions 110 are formed below well regions formed in the n-type epitaxial layer 120. The spacing between the plurality of gate regions 110 define the n-channel active areas Wg 140 of each of the plurality of JFET devices. A large passive area defined as Wp 150 contributes to the gate to drain junction capacitance of the semiconductor device 100.

In addition, surrounding each of the plurality of gate regions 110 are depletion regions Td 170. The depletion regions Td 170 further contribute to the gate to drain p-n junction capacitance of the semiconductor device 100. In certain cases, up to ninety percent of the planar area between the drain region 160 and the plurality of depletion regions Td 170 forms the gate to drain p-n junction capacitance. This large capacitance deleteriously effects the switching capacity of the semiconductor device 100, and, as such, the efficiency of VRM circuitry that includes the semiconductor device 100 is reduced.

SUMMARY OF THE INVENTION

Accordingly, various embodiments of the present invention disclose a structure and method for a semiconductor device having a reduced junction gate capacitance. Embodiments of the present invention may reduce the junction capacitance between a gate and drain region of a semiconductor device. Embodiments of the present invention may also enhance the high frequency performance of the semiconductor device.

Specifically, embodiments of the present invention describe an n-channel junction field effect transistor (JFET) comprising a heavily doped $n^{++}$ substrate forming a drain region, an epitaxial n layer formed on top of the $n^{++}$ substrate, a control structure comprising a p-type gate region implanted into the epitaxial n layer, a source region sharing a p-n junction with the p-type gate region, and an altered epitaxial region. The altered epitaxial region is formed by implanting either high energy $n^-$ or $p^-$ dopants directly below the p-type gate region for enlarging a depletion region surrounding the p-type gate region. The enlarged depletion region reduces the junction capacitance between the p-type gate region and the $n^{++}$ substrate.

In addition, embodiments of the present invention describe a p-channel junction field effect transistor (JFET) comprising a heavily doped $p^{++}$ substrate forming a drain region, an epitaxial p layer formed on top of the $p^{++}$ substrate, a control structure comprising an n-type gate region implanted into the epitaxial p layer, a source region sharing a p-n junction with the n-type gate region, and an altered epitaxial region. The altered epitaxial region is formed by implanting either high energy $n^-$ or $p^-$ dopants directly below the n-type gate region for enlarging a depletion region surrounding the n-type gate region. The enlarged depletion region reduces the junction capacitance between the n-type gate region and the $p^{++}$ substrate.

Embodiments of the present invention also describe a method for forming n-channel and p-channel JFETs with reduced junction gate capacitance. The method includes forming a epitaxial layer on top of an $n^{++}$ substrate, forming a plurality of source regions disposed on top of a surface of the epitaxial layer, forming at least one well region in the epitaxial layer defined on either side by source regions from the plurality of n⁺ source regions, forming a gate region surrounding a bottom of the well region in the epitaxial layer, and forming an altered epitaxial region directly below the gate region for extending a depletion region surrounding the gate region. The depletion region is extended into the n-type epitaxial region without compromising an active region of the JFET, thereby reducing the junction gate capacitance between the gate and drain regions.

BRIEF DESCRIPTION OF THE DRAWINGS

PRIOR ART

DETAILED DESCRIPTION OF THE INVENTION

Reference will now be made in detail to the preferred embodiments of the present invention, a junction field effect transistor (JFET) with reduced junction gate to drain capacitance and a method for fabricating the structure, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

U.S. Pat. No. 6,251,716 entitled "JFET Structure and Manufacture Method for Low-On Resistance and Low Voltage Application," issued Jun. 26, 2001, and assigned to the assignee of the present invention, is hereby incorporated herein by reference.

Figure 1:
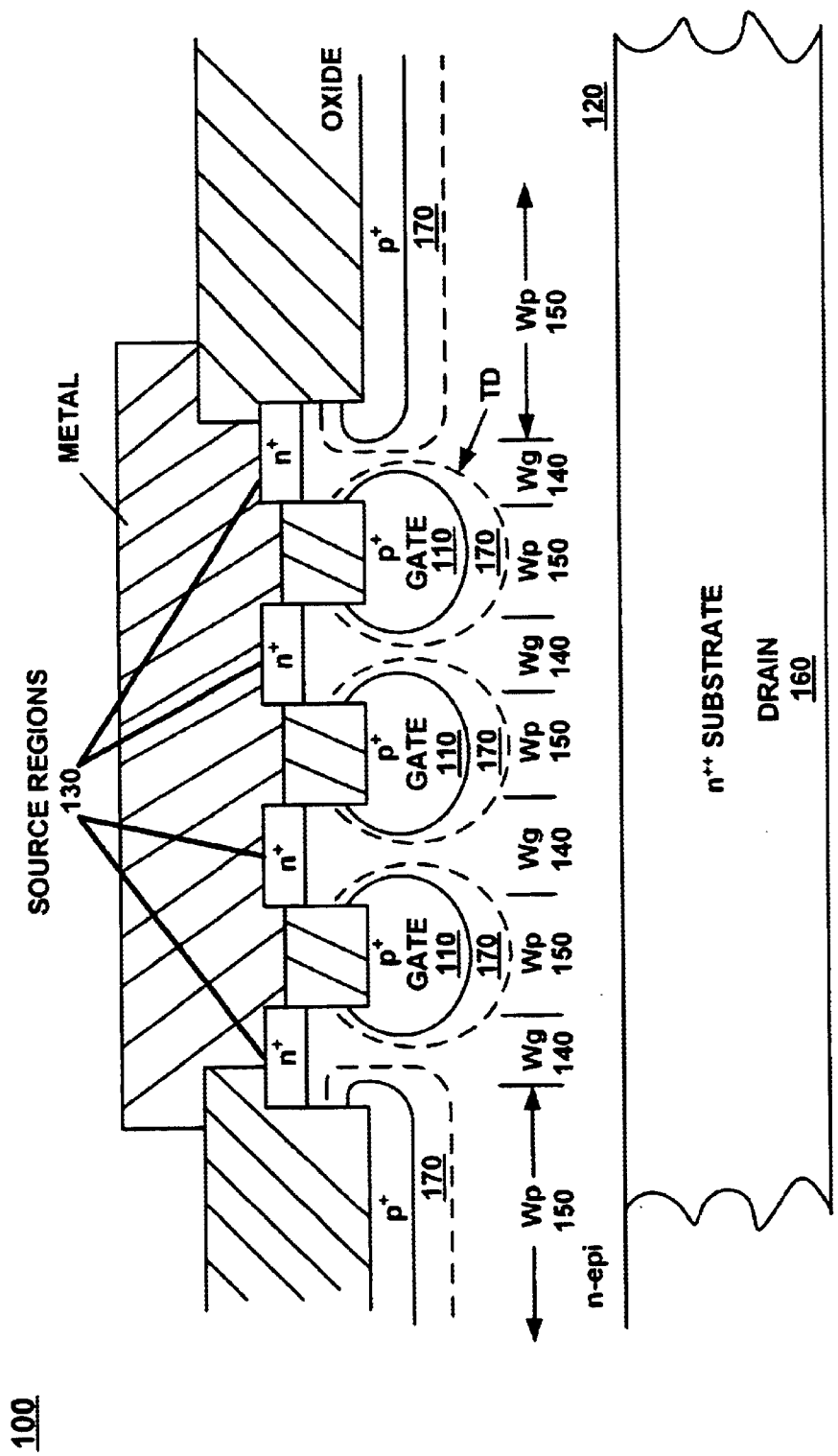
FIG. 1 is a cross section of an n-channel junction field effect transistor (JFET) structure with high junction gate capacitance.
Figure 2:
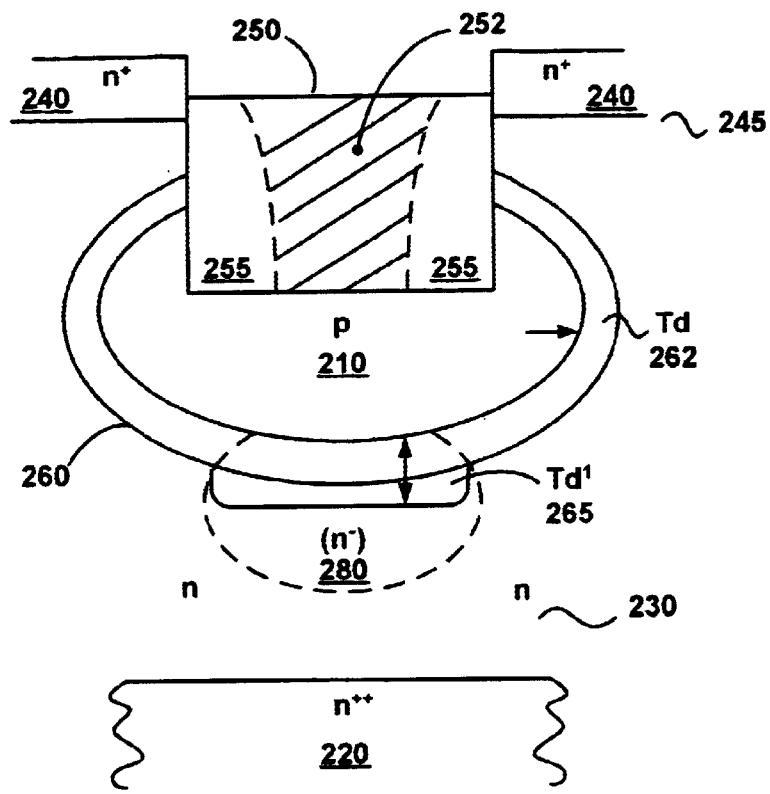
FIG. 2 is a cross section of an n-channel JFET structure with reduced junction gate to drain capacitance, in accordance with one embodiment of the present invention.

FIG. 2 is a cross section of a gate region 210 of an n-channel JFET 200 semiconductor structure with reduced junction gate to drain capacitance, in accordance with one embodiment of the present invention. The gate region 210 of the n-channel JFET 200 can be repeated in a semiconductor substrate to complete one or more n-channel JFET devices.

The JFET 200 includes a heavily doped n⁺⁺ substrate 220. The n⁺⁺ substrate 220 acts as the drain region for the JFET 200. Disposed on top of the n⁺⁺ substrate 220 is an n-type epitaxial layer 230. The dopant concentration of the n-type epitaxial layer 230 is less than the n⁺⁺ substrate 220. On either side of a well region 250 are n⁺ source regions 240 disposed on top of the n-type epitaxial layer 230. The dopant concentration of the n⁺ source regions is between that of the n-type epitaxial layer 230 and the n⁺⁺ substrate 220.

The well region 250 is formed within the n-type epitaxial layer 230 and provides access for the formation of the p-type gate region 210. The p-type gate region 210 can be formed through ion implantation, in one embodiment. In one embodiment, the p-type gate region is formed by the masked implantation of relatively heavy p⁺ ions. Formed within the well region 250 are oxide sidewall or wall spacers 255. The oxide spacers 255 are formed on the sidewall of the well region 250 that extends down from a surface 245 from the n⁺ source regions 240 into the n-type epitaxial layer 230. The sidewalls can be viewed as extending vertically down from the surface 245 that separates the n⁺ source region 240 and the n-type epitaxial layer 230.

The JFET device 200 contains two p-n junctions, each having associated depletion regions. Only one p-n junction is shown in FIG. 2 between the p-type gate region 210 and the n-type epitaxial region 230 for purposes of illustrating the junction gate to drain capacitance. However, the JFET device 200 contains a second p-n junction (not shown) through a second p-type gate region (not shown) that is located to either side of the p-type gate region 210. A conductive channel region located on either side of the p-type gate region 210 is associated with the two p-n junctions. In operation, the voltage variable width of the depletion region 260 is used to control the effective cross sectional area of the conductive channel region, or active area, of the JFET device 200.

The oxide spacers 255 in the well region 250 direct the implantation of dopants into an area of the n-type epitaxial layer 230 that is directly below the p-type gate region 210. Through the implantation of high energy dopants, an altered epitaxial region 280 is created within the n-type epitaxial layer 230, in one embodiment. In FIG. 2, high energy n⁻ dopants are implanted below the p-type gate region 210 into the altered epitaxial region 280. The n⁻ dopant concentration in the altered epitaxial region 280 is less than that of the dopant concentration of the n-type epitaxial layer 230. Oxide 252 can be grown in the well region 250 in one embodiment.

By virtue of the n⁻ dopant concentration in the n-type epitaxial layer 230, the depletion region surrounding the p-type gate region 210 is enlarged. Normally, without the benefit of the altered epitaxial region 280, the width Td 262 of the depletion region 260 is shown. However, with the n⁻ dopant concentration in the altered epitaxial region 280, the depletion region 260 extends further down into the n-type epitaxial layer 230 with a thickness shown by Td' 265. The width Td' 265 is greater than Td 262. As a result, the junction gate to drain capacitance is reduced by as much as thirty percent. A reduction in the junction gate to drain capacitance can lead to increased switching speeds of the JFET device 200.

As a benefit, the effective doping of the n-type epitaxial layer 230 is changed directly under the p-type gate region 210 without changing the doping concentration of the channel regions on either side of the p-type gate region 210. As such, the depletion region 260 on either side of the p-type gate region 210 maintains the same dimensions. Correspondingly, the active region of the JFET device 200 remains unchanged.

Figure 3:
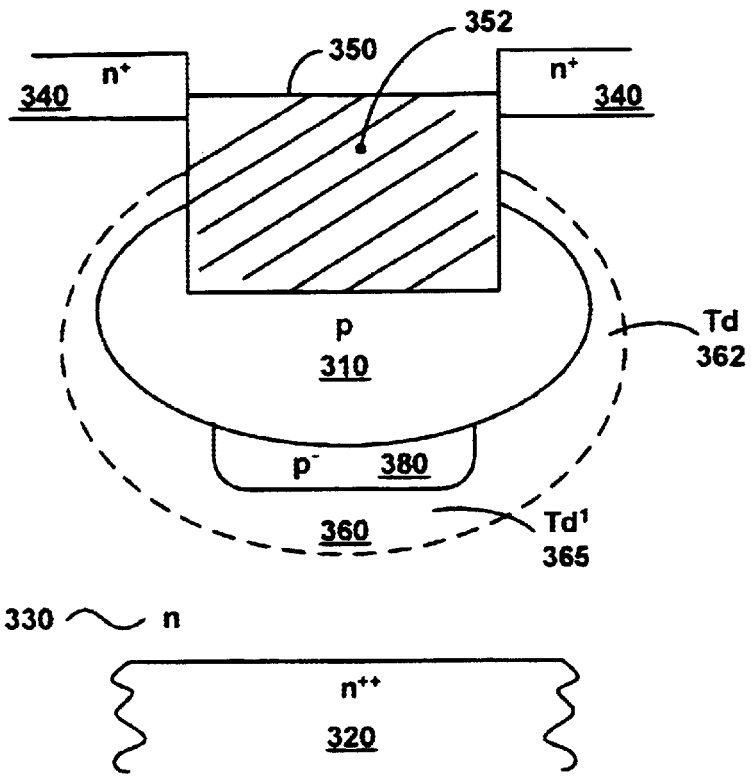
FIG. 3 is a cross section of an n-channel JFET structure with reduced junction gate to drain capacitance, in accordance with one embodiment of the present invention.

FIG. 3 is a cross section of a gate region 310 of an n-channel JFET 300 semiconductor structure with reduced junction gate to drain capacitance, in accordance with one embodiment of the present invention. The gate region 210 of the n-channel JFET 200 can be repeated in a semiconductor substrate to complete one or more n-channel JFET devices.

The JFET 300 includes a heavily doped $n^{++}$ substrate 320. The $n^{++}$ substrate 320 acts as the drain region for the JFET 300. Disposed on top of the $n^{++}$ substrate 320 is an n-type epitaxial layer 330. The dopant concentration of the n-type epitaxial layer 330 is less than the $n^{++}$ substrate 320. On either side of a well region 350 are $n^+$ source regions 340 disposed on top of the n-type epitaxial layer 330. The dopant concentration of the $n^+$ source regions is between that of the n-type epitaxial layer 330 and the $n^{++}$ substrate 320.

The well region 350 is formed within the n-type epitaxial layer 330 and provides access for the formation of the p-type gate region 310. The p-type gate region 310 can be formed through ion implantation, in one embodiment. In one embodiment, the p-type gate region is formed by the masked implantation of relatively heavy $p^+$ ions. Sidewall spacers, such as the spacers 255 in FIG. 2, can also be optionally formed to direct implantation of dopants.

The JFET device 300 contains two p-n junctions, each having associated depletion regions. Only one p-n junction is shown in FIG. 3 between the p-type gate region 310 and the n-type epitaxial region 330 for purposes of illustrating the junction gate to drain capacitance. However, the JFET device 300 contains a second p-n junction (not shown) through a second p-type gate region (not shown) that is located to either side of the p-type gate region 310 A conductive channel region located on either side of the p-type gate region 310 is associated with the two p-n junctions. In operation, the voltage variable width of the depletion region 360 is used to control the effective cross sectional area of the conductive channel region, or active area, of the JFET device 300.

In the present embodiment, $p^-$ dopants are implanted in an area of the n-type epitaxial layer 330 that is directly below the p-type gate region 310 Through the implantation of high energy dopants, an altered epitaxial region 380 is created within the n-type epitaxial layer 230, in one embodiment. In FIG. 3, high energy $p^-$ dopants are implanted below the p-type gate region 310 into the altered epitaxial region 380. The $p^-$ dopant concentration in the altered epitaxial region 380 is less than that of the dopant concentration of the p-type gate region 310. Oxide 352 can be grown in the well region 250 in one embodiment.

By virtue of the $p^-$ dopant concentration in the n-type epitaxial layer 230, the depletion region surrounding the p-type gate region 310 is enlarged. Normally, without the benefit of the altered epitaxial region 380, the width Td 362 of the depletion region 360 is shown. However, with the $p^-$ dopant concentration in the altered epitaxial region 380, the depletion region 360 extends further down into the n-type epitaxial layer 330 with a thickness Td' 365 that is greater than Td 362. As a result, the junction gate to drain capacitance is reduced by as much as thirty percent. A reduction in the junction gate to drain capacitance can lead to increased switching speeds of the JFET device 300.

As a benefit, the effective doping of the n-type epitaxial layer 330 is changed directly under the p-type gate region 310 without changing the doping concentration of the channel regions on either side of the p-type gate region 310. As such, the depletion region 360 on either side of the p-type gate region 310 maintains the same dimensions. Correspondingly, the active region of the JFET device 300 remains unchanged.

Figure 4:
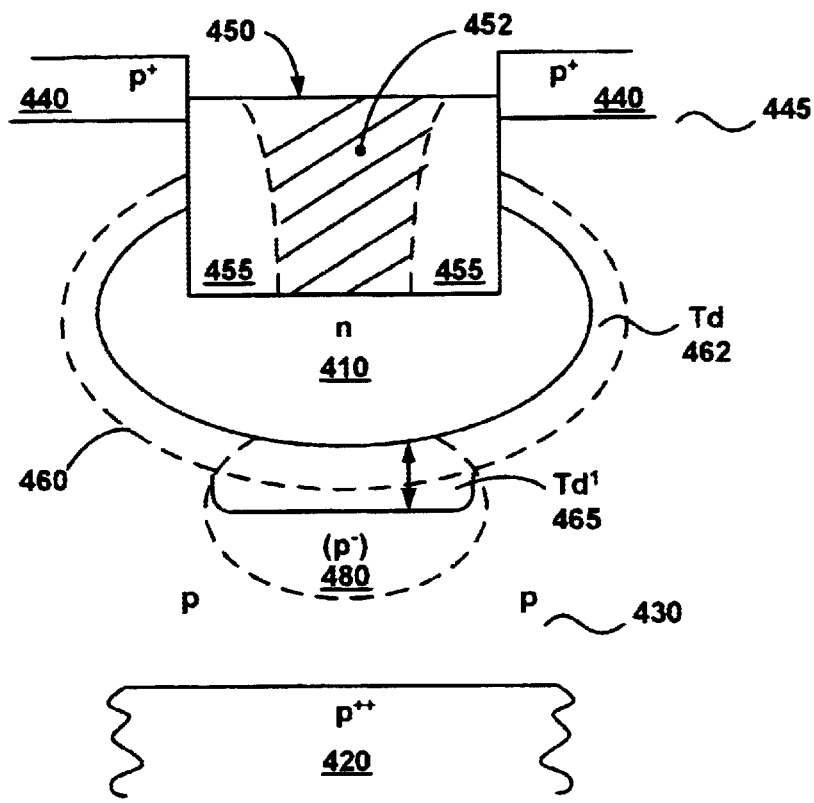
FIG. 4 is a cross section of a p-channel JFET structure with reduced junction gate to drain capacitance, in accordance with one embodiment of the present invention.

Reduced junction gate to drain capacitances for JFET devices similar to those of FIGS. 2 and 3 can be constructed with a reversed doping scheme to provide p-channel JFET devices. FIG. 4 is a cross section of a gate region 410 of a p-channel JFET 400 semiconductor structure with reduced junction gate to drain capacitance, in accordance with one embodiment of the present invention. The gate region 410 of the p-channel JFET 400 can be repeated in a semiconductor substrate to complete one or more p-channel JFET devices.

The JFET 400 includes a heavily doped $p^{++}$ substrate 420. The $p^{++}$ substrate 420 acts as the drain region for the JFET 400. Disposed on top of the $p^{++}$ substrate 420 is a p-type epitaxial layer 430. The dopant concentration of the p-type epitaxial layer 430 is less than the $p^{++}$ substrate 420. On either side of a well region 450 are $p^+$ source regions 440 disposed on top of the p-type epitaxial layer 430. The dopant concentration of the $p^+$ source regions 440 is between that of the p-type epitaxial layer 430 and the $p^{++}$ substrate 420.

The well region 450 is optionally formed within the p-type epitaxial layer 430 and provides access for the formation of the n-type gate region 410. The n-type gate region 410 can be formed through ion implantation, in one embodiment. In one embodiment, the n-type gate region 410 is formed by the masked implantation of relatively heavy $n^+$ ions. Optionally formed within the well region 450 are oxide sidewall or wall spacers 455. The oxide spacers 455 are formed on the sidewall of the well region 450 that extends down from a surface 445 from the $p^+$ source regions 440 into the p-type epitaxial layer 430. The sidewalls can be viewed as extending vertically down from the surface 445 that separates the $p^+$ source regions 440 and the p-type epitaxial layer 430.

The JFET device 400 contains two p-n junctions, each having associated depletion regions. Only one p-n junction is shown in FIG. 4 between then n-type gate region 410 and the p-type epitaxial region 430 for purposes of illustrating the junction gate to drain capacitance. However, the JFET device 400 contains a second p-n junction (not shown) through a second n-type gate region (not shown) that is located to either side of the n-type gate region 410. A conductive channel region located on either side of the n-type gate region 410 is associated with the two p-n junctions. In operation, the voltage variable width of the depletion region 460 is used to control the effective cross sectional area of the conductive channel region, or active area, of the JFET device 400.

The oxide spacers 455 in the well region 450 direct the implantation of dopants into an area of the p-type epitaxial layer 230 that is directly below the n-type gate region 410. Through the implantation of high energy dopants, an altered epitaxial region 480 is created within the p-type epitaxial layer 230, in one embodiment. In FIG. 4, high energy $p^-$ dopants are implanted below the n-type gate region 410 into the altered epitaxial region 480. The $p^-$ dopant concentration in the altered epitaxial region 480 is less than that of the dopant concentration of the p-type epitaxial layer 430. Oxide 452 can be grown in the well region 450 in one embodiment.

By virtue of the p⁻ dopant concentration in the p-type epitaxial layer 430, the depletion region 460 surrounding the n-type gate region 410 is enlarged. Normally, without the benefit of the altered epitaxial region 480, the width Td 462 of the depletion region 460 is shown. However, with the p⁻ dopant concentration in the altered epitaxial region 480, the depletion region 460 extends further down into the p-type epitaxial layer 430 with a thickness shown by Td' 465. The width Td' 465 is greater than Td 462. As a result, the junction gate to drain capacitance is reduced by as much as thirty percent. A reduction in the junction gate to drain capacitance can lead to increased switching speeds of the JFET device 400.

As a benefit, the effective doping of the p-type epitaxial layer 430 is changed directly under the n-type gate region 410 without changing the doping concentration of the channel regions on either side of the n-type gate region 410. As such, the depletion region 460 on either side of the n-type gate region 410 maintains the same dimensions. Correspondingly, the active region of the JFET device 400 remains unchanged.

Figure 5:
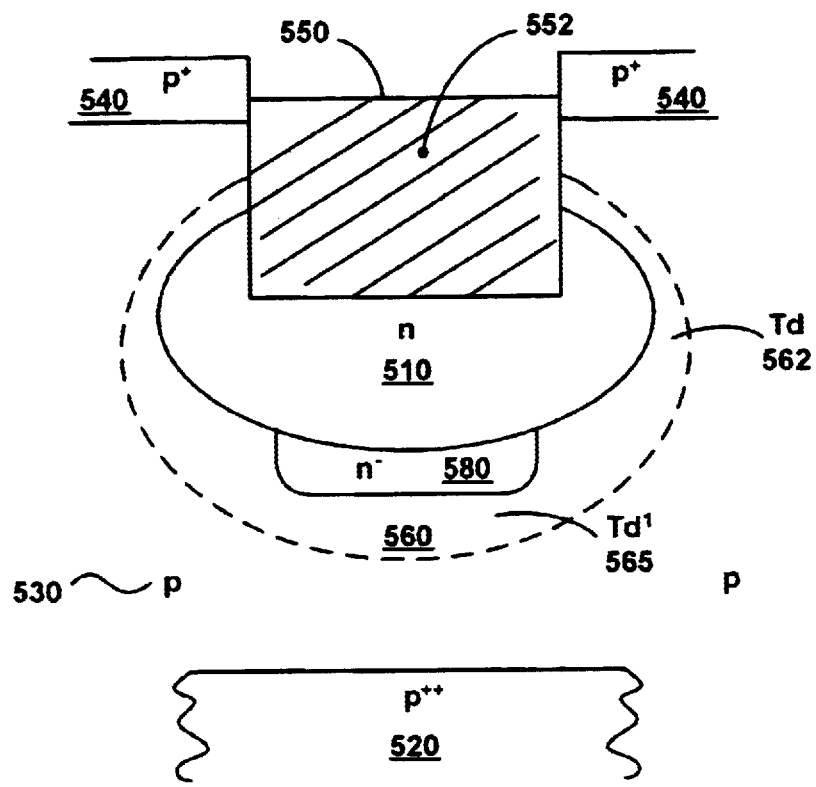
FIG. 5 is a cross section of a p-channel JFET structure with reduced junction gate to drain capacitance, in accordance with one embodiment of the present invention.

FIG. 5 is a cross section of a gate region 510 of an p-channel JFET 500 semiconductor structure with reduced junction gate to drain capacitance due to the implantation of an n⁻ dopant, in accordance with one embodiment of the present invention. The gate region 510 of the p-channel JFET 500 can be repeated in a semiconductor substrate to complete one or more p-channel JFET devices.

The JFET 500 includes a heavily doped p⁺⁺ substrate 520. The n⁺⁺ substrate 520 acts as the drain region for the JFET 500. Disposed on top of the p⁺⁺ substrate 520 is an p-type epitaxial layer 530. The dopant concentration of the p-type epitaxial layer 530 is less than the p⁺⁺ substrate 520. On either side of a well region 550 are p⁺ source regions 540 disposed on top of the p-type epitaxial layer 530. The dopant concentration of the p⁺ source regions is between that of the p-type epitaxial layer 530 and the p⁺⁺ substrate 520.

The well region 550 is formed within the p-type epitaxial layer 530 and provides access for the formation of the n-type gate region 510. The n-type gate region 510 can be formed through ion implantation, in one embodiment. In one embodiment, the n-type gate region is formed by the masked implantation of relatively heavy n⁺ ions. Sidewall spacers, such as the spacers 455 in FIG. 4, can also be optionally formed to direct implantation of dopants.

The JFET device 500 contains two p-n junctions, each having associated depletion regions. Only one p-n junction is shown in FIG. 5 between the n-type gate region 510 and the p-type epitaxial region 530 for purposes of illustrating the junction gate to drain capacitance. However, the JFET device 500 contains a second p-n junction (not shown) through a second n-type gate region (not shown) that is located to either side of the n-type gate region 510 A conductive channel region located on either side of the n-type gate region 510 is associated with the two p-n junctions. In operation, the voltage variable width of the depletion region 560 is used to control the effective cross sectional area of the conductive channel region, or active area, of the JFET device 500.

In the present embodiment, n⁻ dopants are implanted in an area of the p-type epitaxial layer 530 that is directly below the n-type gate region 510 Through the implantation of high energy dopants, an altered epitaxial region 580 is created within the p-type epitaxial layer 530, in one embodiment. In FIG. 5, high energy n⁻ dopants are implanted below the n-type gate region 510 into the altered epitaxial region 580.

The n⁻ dopant concentration in the altered epitaxial region 580 is less than that of the dopant concentration of the n-type gate region 510. Oxide 552 can be grown in the well region 550 in one embodiment.

By virtue of the n⁻ dopant concentration in the p-type epitaxial layer 530, the depletion region surrounding the n-type gate region 510 is enlarged. Normally, without the benefit of the altered epitaxial region 580, the width Td 562 of the depletion region 560 is shown. However, with the n⁻ dopant concentration in the altered epitaxial region 580, the depletion region 560 extends further down into the p-type epitaxial layer 530 with a thickness Td' 565 that is greater than Td 562. As a result, the junction gate to drain capacitance is reduced by as much as thirty percent. A reduction in the junction gate to drain capacitance can lead to increased switching speeds of the JFET device 500.

As a benefit, the effective doping of the p-type epitaxial layer 530 is changed directly under the n-type gate region 510 without changing the doping concentration of the channel regions on either side of the n-type gate region 510. As such, the depletion region 560 on either side of the n-type gate region 510 maintains the same dimensions. Correspondingly, the active region of the JFET device 500 remains unchanged.

Figure 6:
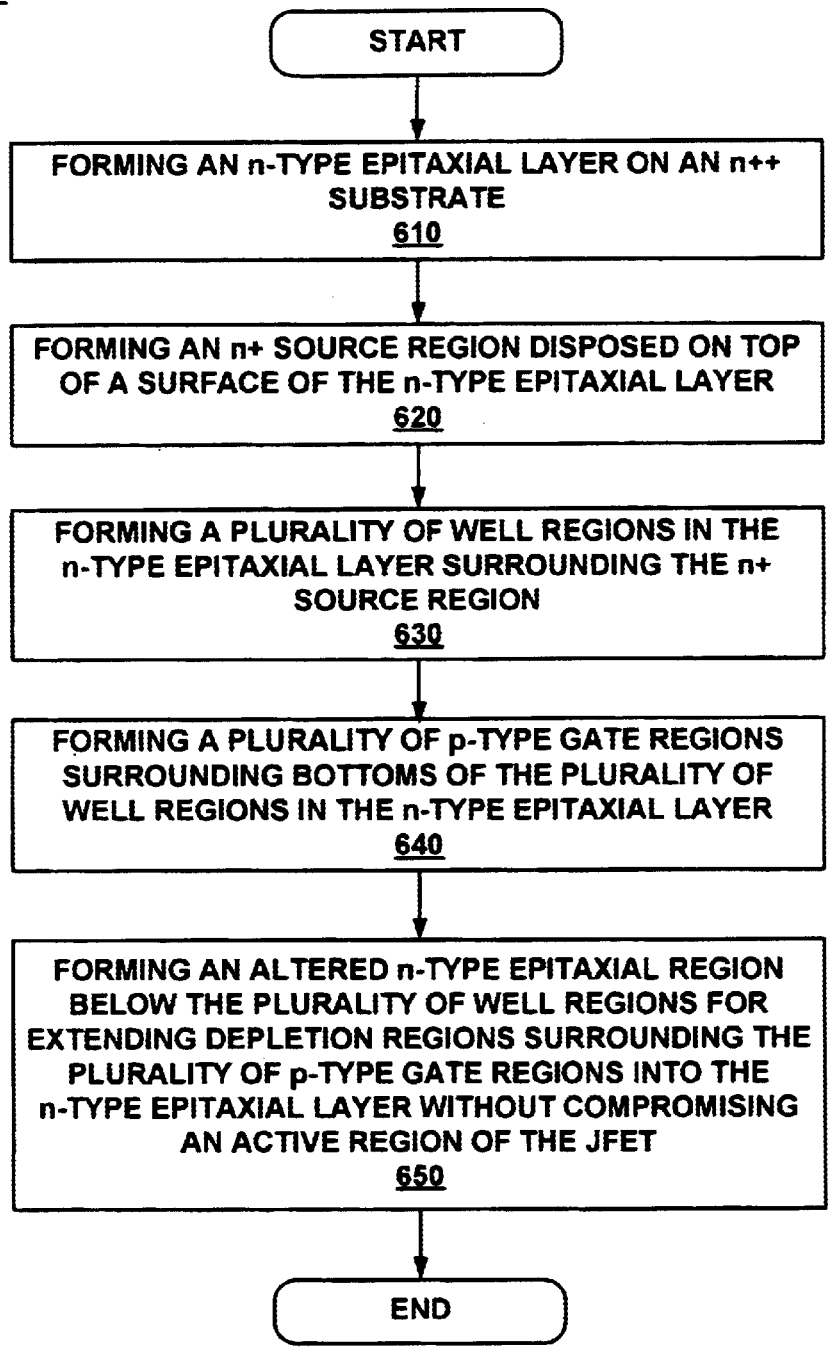
FIG. 6 is a flow chart illustrating steps in a method for fabricating an n-channel JFET structure with reduced junction gate to drain capacitance, in accordance with one embodiment of the present invention.

FIG. 6 is a flow chart 600 illustrating steps in a method for fabricating an n-channel JFET device similar to that in FIGS. 2 and 3, in accordance with one embodiment of the present invention. The present embodiment begins by forming an n-type epitaxial layer on an n⁺⁺ substrate, in step 610. The n-type epitaxial layer has a dopant concentration less than the n⁺⁺ substrate.

In step 620, an n⁺ source region is disposed on top of a surface of the n-type epitaxial layer. The n⁺ source region has a dopant concentration that is lower than the dopant concentration of the n⁺⁺ substrate, but higher than the dopant concentration of the n-type epitaxial layer.

In step 630, a plurality of well regions are formed in the n-type epitaxial layer. Each of the plurality of well regions lie on either side of the n⁺ source region. Once the well regions are formed, oxide spacers can also be formed on the walls of the well region. The walls of the well region can be defined as the wall that extends down from the surface between the n-type epitaxial layer and the n⁺ source region. The wall extends down from the surface into the n-type epitaxial layer for directing dopants into a specific area of the epitaxial layer. Further, the well region can be filled with oxide.

In step 640, a plurality of p-type gate regions are formed around bottoms of the plurality of well regions. The plurality of p-type gate regions are formed in the n-type epitaxial layer, and in one embodiment, are formed by ion implantation.

In step 650, an altered n-type epitaxial region is formed directly below the plurality of well regions. The altered n-type epitaxial region extends the depletion regions surrounding the plurality of p-type gate regions into the n-type epitaxial region without compromising an active region of the JFET.

In one embodiment a lightly doped n⁻ layer is implanted in the altered n-type epitaxial layer. The lightly doped n⁻ layer has a doping concentration that is less than that of the n-type epitaxial layer.

In another embodiment, a lightly doped p⁻ layer is implanted in the altered n-type epitaxial layer. The lightly doped p⁻ layer has a doping concentration that is less than that of the p-type gate region.

Figure 7:
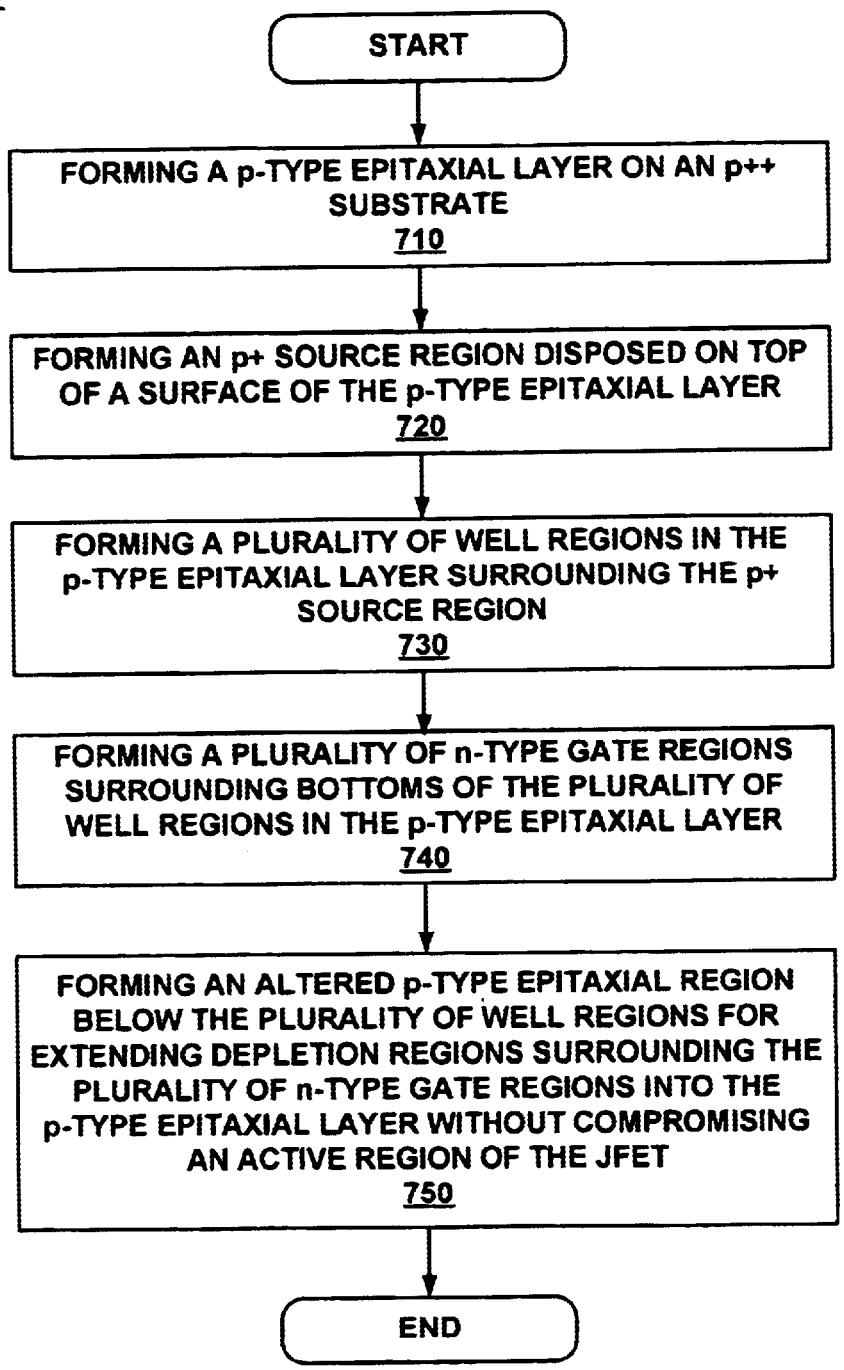
FIG. 7 is a flow chart illustrating steps in a method for fabricating a p-channel JFET structure with reduced junction gate to drain capacitance, in accordance with one embodiment of the present invention.

FIG. 7 is a flow chart 700 illustrating steps in a method for fabricating a p-channel JFET device similar to that in FIGS. 4 and 5, in accordance with one embodiment of the present invention. The present embodiment begins by forming an p-type epitaxial layer on a $p^{++}$ substrate, in step 710. The p-type epitaxial layer has a dopant concentration that is less than the $p^{++}$ substrate.

In step 720, a $p^+$ source region is disposed on top of a surface of the p-type epitaxial layer. The $p^+$ source region has a dopant concentration that is lower than the dopant concentration of the $p^{++}$ substrate, but higher than the dopant concentration of the p-type epitaxial layer.

In step 730, a plurality of well regions are formed in the p-type epitaxial layer. Each of the plurality of well regions lie on either side of the $p^+$ source region. Once the well regions are formed, oxide spacers can also optionally be formed on the walls of the well region. The walls of the well region can be defined as the wall that extends down from the surface between the p-type epitaxial layer and the $p^+$ source region. The wall extends down from the surface into the p-type epitaxial layer for directing dopants into a specific area of the epitaxial layer. Further, the well region can be filled with oxide.

In step 740, a plurality of n-type gate regions are formed around bottoms of the plurality of well regions. The plurality of n-type gate regions are formed in the p-type epitaxial layer, and in one embodiment, are formed by ion implantation.

In step 750, an altered p-type epitaxial region is formed directly below the plurality of well regions. The altered p-type epitaxial region extends the depletion regions surrounding the plurality of n-type gate regions into the p-type epitaxial region without compromising an active region of the JFET.

In one embodiment a lightly doped $p^-$ layer is implanted in the altered p-type epitaxial layer. The lightly doped $p^-$ layer has a doping concentration that is less than that of the p-type epitaxial layer.

In another embodiment, a lightly doped $n^-$ layer is implanted in the altered p-type epitaxial layer. The lightly doped $n^-$ layer has a doping concentration that is less than that of the n-type gate region.

While the methods of embodiments illustrated in flow charts 600 and 700 show specific sequences and quantity of steps, the present invention is suitable to alternative embodiments. For example, not all the steps provided for in the methods are required for the present invention. Furthermore, additional steps can be added to the steps presented in the present embodiment. Likewise, the sequences of steps can be modified depending upon the application.

Embodiments of the present invention, a JFET structure having reduced gate to drain junction capacitance, and a method of fabricating the JFET structure, are thus described. While the present invention has been described in particular embodiments, it should be appreciated that the present invention should not be construed as limited by such embodiments, but rather construed according to the below claims.

What is claimed is:

1. A method of fabricating a junction field effect transistor (JFET) comprising:
   a) on an $n^{++}$ substrate, forming an n-type epitaxial layer comprising a dopant concentration less than said $n^{++}$ substrate;
   b) forming a $n^+$ source region disposed on top of a surface of said n-type epitaxial layer, said $n^+$ source region having a dopant concentration in between said $n^{++}$ substrate and said n-type epitaxial layer;
   c) forming a plurality of well regions in said n-type epitaxial layer surrounding said $n^+$ source region;
   d) forming a plurality of p-type gate regions surrounding bottoms of said plurality of well regions in said n-type epitaxial layer; and
   e) forming an altered n-type epitaxial region below said plurality of well regions for extending depletion regions surrounding said plurality of p-type gate regions into said n-type epitaxial layer without compromising an active region of said JFET.

2. The method of fabricating a JFET as described in claim 1, further comprising:
   before e), forming an oxide spacer on walls of at least one of said plurality of well regions that extend down from said surface into said n-type epitaxial region for directing dopants into said altered n-type epitaxial region in step e).

3. The method of fabricating a JFET as described in claim 2, further comprising:
   filling at least one of said well regions with oxide.

4. The method of fabricating a JFET as described in claim 1, wherein e) comprises:
   implanting a lightly doped $n^-$ layer directly below said plurality of well regions, said lightly doped $n^-$ layer comprising a second dopant concentration less than that of said n-type epitaxial layer.

5. The method of fabricating a JFET as described in claim 1, wherein e) comprises:
   implanting a lightly doped $p^-$ layer directly below said plurality of well regions, said lightly doped $p^-$ layer comprising a second dopant concentration less than that of said p-type gate region.

6. A method of fabricating a junction field effect transistor (JFET) comprising:
   a) on an $p^{++}$ substrate, forming an p-type epitaxial layer comprising a dopant concentration less than said $p^{++}$ substrate;
   b) forming a $p^+$ source region disposed on top of a surface of said p-type epitaxial layer, said $p^+$ source region comprising a dopant concentration in between said $p^{++}$ substrate and said p-type epitaxial layer;
   c) forming a plurality of well regions in said p-type epitaxial layer surrounding said $p^+$ source region;
   d) forming a plurality of n-type gate regions surrounding bottoms of said plurality of well regions in said p-type epitaxial layer; and
   e) forming an altered p-type epitaxial region below said plurality of well regions for extending depletion regions surrounding said plurality of n-type gate regions into said p-type epitaxial layer without compromising an active region of said JFET.

7. The method of fabricating a JFET as described in claim 6, further comprising:
   filling said well region with oxide.

8. The method of fabricating a JFET as described in claim 6, further comprising:
   before e), forming an oxide spacer on walls of at least one of said plurality of well regions, said walls extending down from said surface into said p-type epitaxial region for directing dopants into said altered p-type epitaxial region in step e).

9. The method of fabricating a JFET as described in claim 6, wherein e) comprises:

implanting a lightly doped p⁻ layer directly below said well region, said lightly doped p⁻ layer comprising a second dopant concentration less than that of said p-type epitaxial layer.

10. The method of fabricating a JFET as described in claim 6, wherein e) comprises:

implanting a lightly doped n⁻ layer directly below said well region, said lightly doped n⁻ layer comprising a second dopant concentration less than that of said n-type gate region.

11. A method for forming a junction field effect transistor (JFET) comprising:

forming a drain region comprising a heavily doped n⁺⁺ substrate;

forming an epitaxial n layer comprising a dopant concentration less than that of said n⁺⁺ substrate, said epitaxial n layer formed on top of said n⁺⁺ substrate;

forming a control structure comprising a p-type gate region implanted into said epitaxial n layer;

forming a source region sharing a p-n junction with said p-type gate region; and forming an altered epitaxial region below said p-type gate region for enlarging a depletion region surrounding said p-type gate region, wherein said altered epitaxial region comprises a lightly doped p⁻ layer, wherein said lightly doped p⁻ layer comprises a second dopant concentration less than that of said p-type gate region.

12. The method of claim 11, further comprising:

implanting said lightly doped p⁻ layer at a higher energy than that associated with said p-type gate region.

13. The method of claim 11, further comprising:

forming a well region below a surface of said epitaxial n layer, said oxide well region above said p-type gate region; and forming an oxide spacer on walls of said well region extending from a surface of said epitaxial n layer down into said epitaxial n layer, said oxide spacer for directing implantation of dopants into said altered epitaxial region.

14. The method of claim 13, further comprising:

filling said well region with oxide.

15. The method of claim 11, further comprising:

reducing a junction capacitance between said p-type gate region and said drain region by further extending said depletion region into said epitaxial n layer, without compromising an active region of said JFET.

16. A method for forming a junction field effect transistor (JFET) comprising:

forming a heavily doped p⁺⁺ substrate forming a drain region;

forming an epitaxial p layer comprising a dopant concentration less than that of said p⁺⁺ substrate, said epitaxial p layer formed on top of said p⁺⁺ substrate;

forming a control structure comprising a n-type gate region implanted into said epitaxial p layer;

forming a source region sharing a p-n junction with said n-type gate region; and forming an altered epitaxial region below said n-type gate region for widening a enlarging region surrounding said n-type gate region, wherein said altered epitaxial region comprises a lightly doped n⁻ layer, wherein said lightly doped n⁻ layer comprises a second dopant concentration less than that of said n-type gate region.

17. The method of claim 16, further comprising:

implanting said lightly doped n⁻ layer at a higher energy than that associated with said n-type gate region.

18. The method of claim 16, further comprising:

forming a well region below a surface of said epitaxial p layer, said oxide well region above said n-type gate region; and forming an oxide spacer on an approximately vertical surface between said well region and said epitaxial p layer, said oxide spacer for directing implantation of dopants into said altered epitaxial region.

19. The method of claim 18, further comprising:

filling said well region with oxide.

20. The method of claim 16, further comprising:

reducing a junction capacitance between said n-type gate region and said drain region by further extending said depletion region into said epitaxial p layer, without compromising an active region of said JFET.

* * * * *